United States Patent
Matsubara et al.

[11] Patent Number: 6,160,414
[45] Date of Patent: Dec. 12, 2000

[54] METHOD FOR DIAGNOSING ABNORMALITY OF CIRCUIT MEMBER OF INVERTER DRIVING CONTROLLER FOR DRIVING AND CONTROLLING MOTOR

[75] Inventors: Shunsuke Matsubara, Minamitsuru-gun; Yuichi Yamada, Oshino-mura, both of Japan

[73] Assignee: Fanuc Ltd., Yamanishi, Japan

[21] Appl. No.: 09/029,713

[22] PCT Filed: Jul. 3, 1997

[86] PCT No.: PCT/JP97/02317

§ 371 Date: Jun. 29, 1998

§ 102(e) Date: Jun. 29, 1998

[87] PCT Pub. No.: WO98/01944

PCT Pub. Date: Jan. 15, 1998

[30] Foreign Application Priority Data

Jul. 3, 1996 [JP] Japan ................................. 8-191642

[51] Int. Cl.[7] .................................................. G01R 31/26
[52] U.S. Cl. ............................. 324/765; 324/158.1
[58] Field of Search ............................ 324/765, 158.1, 324/537; 340/644, 653

[56] References Cited

U.S. PATENT DOCUMENTS

| | | | |
|---|---|---|---|
| 4,384,248 | 5/1983 | Matsuda et al. | 324/537 |
| 4,659,983 | 4/1987 | Jacob | 324/158.1 |
| 5,266,891 | 11/1993 | Kumar et al. | 324/765 |
| 5,363,039 | 11/1994 | Kumar et al. | 324/158.1 |
| 5,376,881 | 12/1994 | Takahashi | 324/158.1 |
| 5,497,095 | 3/1996 | Ueyama et al. | 324/158.1 |

FOREIGN PATENT DOCUMENTS

| | | |
|---|---|---|
| 0 652 445 A2 | 5/1995 | European Pat. Off. . |
| 36011160 A1 | 7/1987 | Guadeloupe . |
| 63-85380 | 4/1988 | Japan . |
| 63-202198 | 12/1988 | Japan . |
| 2-197294 | 8/1990 | Japan . |
| 6-205599 | 7/1994 | Japan . |
| 8-29470 | 2/1996 | Japan . |
| 8-80056 | 3/1996 | Japan . |

*Primary Examiner*—Ernest Karlsen
*Attorney, Agent, or Firm*—Staas & Halsey LLP

[57] ABSTRACT

Selected switching devices (e.g., Tra and Trd) of an inverter are turned on to supply a current between selected phases. If the respective inclinations of current waveforms then detected by current detection circuits IR and IS are equal to a reference inclination, it can be concluded that the current detection circuit in a circuit through which the current then flows, switching devices, and motor windings are normal. If the inclinations of the detected current waveforms are "0" or smaller than the reference, it can be concluded that the current detection circuits, switching devices, or motor windings are abnormal. In such a case, an abnormal spot is identified by checking the inclinations of the waveforms of the current detection circuits in like manner after changing the switching device to be turned on. If the inclinations of the detected current waveforms are very much greater than the reference, cables or motor windings can be concluded to be shorted.

7 Claims, 2 Drawing Sheets

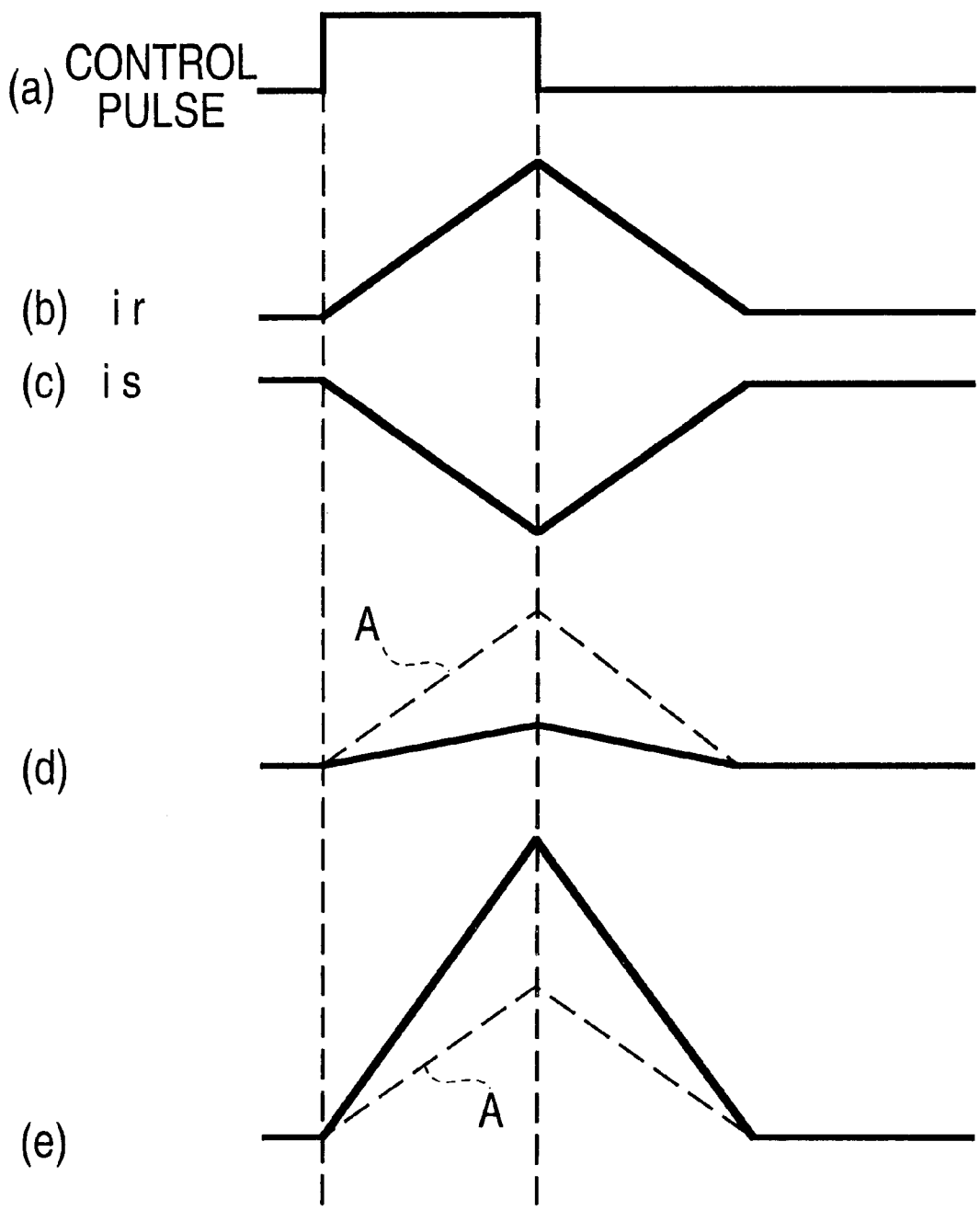

METHOD FOR DIAGNOSING ABNORMALITY OF CIRCUIT MEMBER OF INVERTER DRIVING CONTROLLER FOR DRIVING AND CONTROLLING MOTOR

TECHNICAL FIELD

The present invention relates to an abnormality diagnosis method for diagnosing failures and the like of various circuit components of an inverter drive control apparatus for drivingly controlling a motor.

BACKGROUND ART

In a typical method for detecting abnormalities such as failures in circuit components and elements in an electric circuit, current, voltage, resistance, etc. of those spots which are supposed to be abnormal are measured by means of a tester, ammeter, voltmeter, etc. to detect abnormalities. A similar method is conventionally used to detect and diagnose abnormalities in an inverter drive control apparatus for drivingly controlling a motor by means of an inverter.

According to the aforesaid abnormality diagnosis method using the tester and the like, measurement must be carried out after removing covers for supposedly abnormal spots and other members that hinder the measurement. If no abnormalities are detected as a result of the measurement, other spots must be measured in like manner after reassembling the removed member. Thus, the detection and diagnosis of abnormalities require much time and labor.

DISCLOSURE OF THE INVENTION

The object of the present invention is to make easier the detection and diagnosis of abnormalities in various circuit components that constitute an inverter drive control apparatus for drivingly controlling a motor.

In order to achieve the above object, an abnormality diagnosis method according to the present invention for diagnosing the abnormalities of the circuit components of an inverter drive control apparatus for drivingly controlling a motor comprises first turning on only a selected one of a plurality of switching devices constituting an inverter, then supplying a current between selected phases, and troubleshooting the circuit members through which the current flows in accordance with detection results detected by current detection circuits corresponding to the phases.

Preferably, the selection of the switching device to be turned on and the selection of the phases associated therewith are carried out at least twice in different combinations, and the circuit members to be concluded to be abnormal are identified by comparing the results of detection in the current detection circuit for each cycle.

Preferably, the current supplied for abnormality diagnosis is control pulses with a given width. Further, the detection results detected by the current detection circuits are current leading-edge waveforms or trailing-edge waveforms.

According to the present invention, as described above, abnormalities can be detected and diagnosed for transistors as the switching devices in the drive and control apparatus for the motor using the inverter, diodes connected in parallel with the transistors, the current detection circuits for detecting the current flowing through windings for individual phases, cables connected to the windings for the individual phases of the motor, etc.

BRIEF DESCRIPTION OF THE DRAWINGS

FIG. 2 is a diagram for illustrating detected currents according to this embodiment.

BEST MODE FOR CARRYING OUT THE INVENTION

Figure 1:
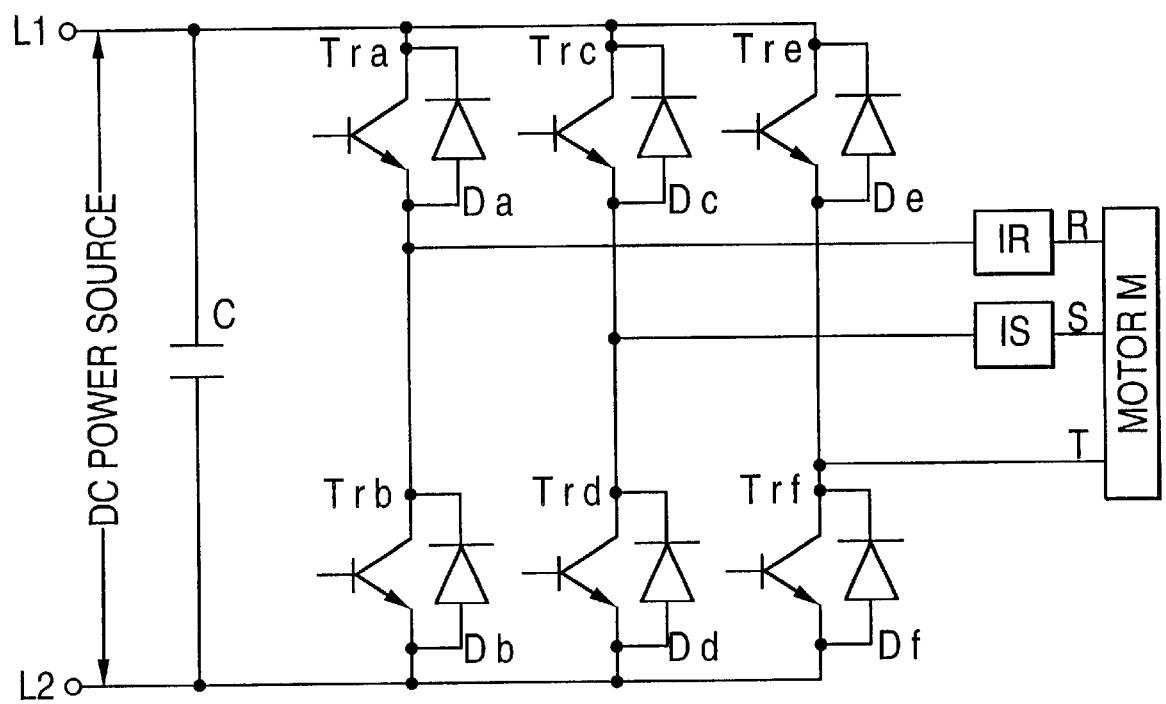
FIG. 1 is a circuit diagram showing the principal part of a motor drive and control apparatus using an inverter to which one embodiment of the present invention is applied.

FIG. 1 is a circuit diagram showing the principal part of a drive control apparatus designed for driving and controlling a motor by means of an inverter. Connected between a positive terminal L1 and a negative terminal L2 is a DC power source by which the current from a three-phase AC power source is converted into DC current by means of a diode bridge circuit (not shown) or the like. Symbol C designates a capacitor for smoothing the voltage of the direct current obtained by conversion. Two sets of circuits, each including switching devices (transistor) and diodes connected in parallel for each phase of the motor, are connected in series between the aforesaid terminals L1 and L2. More specifically, a parallel circuit of a switching device Tra and a diode Da and a parallel circuit of a switching device Trb and a diode Db are connected in series with each other, and are connected between the aforesaid terminals L1 and L2. Likewise, a series circuit, composed of a parallel circuit of a switching device Trc and a diode Dc and a parallel circuit of a switching device Trd and a diode Dd, and another series circuit, composed of a parallel circuit of a switching device Tre and a diode De and a parallel circuit of a switching device Trf and a diode Df, are also connected individually between the aforesaid terminals L1 and L2.

The junction points of each series circuit of two parallel circuit bodies composed of a switching device and a diode are connected individually to R-, S-, and T-phase winding terminals of the motor. These circuits composed of the switching devices and diodes constitute the inverter. Further, the circuit of FIG. 1 is provided with current detection circuits IR and IS for detecting R- and S-phase currents. The detected current values are fed back and utilized for the feedback control of current to be supplied to the motor. Also, a current for the T-phase is synthesized from the current values detected by means of the current detection circuits, IR and IS, and is utilized for current feedback control.

The aforementioned circuit of FIG. 1 is a well-known circuit of the drive control apparatus for the motor that is drivingly controlled by means of the inverter, and is not different at all from a conventional circuit.

In carrying out abnormality diagnosis, control pulses are applied to the respective bases of the transistors, the switching devices Tra and Trd, as shown in ($a$) of FIG. 2, whereby the switching devices Tra and Trd are turned on. Thereupon, current flows from the positive terminal L1 of the DC power source to the negative terminal L2 of the DC power source via the switching device Tra, R- and S-phases of the motor M, and switching device Trd. The current is detected and fed back by the R-phase current detection circuit IR and the S-phase current detection circuit IS. This feedback current is ready by means of an oscilloscope. When the circuit through which this current flows is not abnormal, a current ir detected by the R-phase current detecting circuit IR has the leading-edge waveform shown in ($b$) of FIG. 2. Since a current is detected by the S-phase current detecting circuit IS flows in a different direction, it has a leading-edge waveform of the opposite sign with the same size and inclination ($ir=-is$).

When the control pulses are turned off, current is made to flow through the diode Db, R- and S-phases of the motor, and diode Dc by means of energy that is stored in the motor windings, whereupon the capacitor C is charged. This current is also detected by the current detecting circuits IR and IS, as shown in (b) and (c) of FIG. 2.

When the configuration of the inverter, configuration of the motor, and voltage of the DC power source are specified, the inclination of the respective waveforms of the currents ir and is is obtained by calculation, whereupon a reference value is obtained. Unless the difference between this reference value and a measured value is so large, the inclination of the detected current waveforms can be adjusted to the reference value by regulating the respective gains of the current detection circuits IR and IS.

In the case where one of the respective waveform inclinations of the currents ir and is detected by the current detection circuits IR and IS is equal to an inclination of a reference A, and if the other is very small, as indicated by full line in (d) of FIG. 2, or "0", it can be concluded that the detection circuit which has detected such a very small inclination or "0" inclination is abnormal. Further, if both the waveform inclinations of the currents ir and is detected by the current detection circuits IR and IS are "0" or very small, it can be supposed that both the current detection circuits IR and IS are abnormal, or either the switching device Tra or Trd, or cables in a circuit through which the currents are expected to flow, or the R- or S-phase winding is subject to a failure such as snapping. In this case, it is necessary only that the currents be measured after changing the combination of the switching devices to be turned on so that an abnormal spot can be specified. For example, abnormality can be determined by the following measures. For brevity, only symbols will be referred to in the following description.

When Tra and Trd are turned on, (a) both ir and is having an inclination corresponding to the reference A: normal, (b) the inclination of ir being normal, while the inclination of is being small or "0": IS is abnormal, (c) the inclination of is being normal, while the inclination of ir being small or "0": IR is abnormal, (d) both the respective inclinations of ir and is being small or "0": both IR and IS are abnormal, or Tra, Trd, cables or the R- and S-phase windings in the circuit are abnormal.

The aforesaid case (a) indicates that the current detection circuits IR and IS are operating normally and that the switching devices Tra and Trd, R- and S-phase windings, and cables are also normal. After confirming this, therefore, it is necessary only that the switching devices to be turned on be changed to detect abnormalities in the switching devices Trb, Trc, Tre and Trf, T-phase windings, and T-phase cable. For example, if the waveform inclination of the current ir detected by the current detection circuit IR corresponds to the reference value at the time when the switching devices Tra and Trf are ON, it can be concluded that the T-phase winding, T-phase cable, and switching device Trf are normal. However, if the waveform inclination of the current ir detected by the current detection circuit IR is "0" or small, it implies that the T-phase windings, T-phase cable, or switching device Trf is abnormal. In this case, if the waveform inclination of the current ir detected by the current detection circuit IR with the switching devices Tre and Trb turned on is equal to the inclination corresponding to the reference A, the switching device Trf turned can be presumed to be abnormal.

Further, in the case of (d) of FIG. 2, the combination of the switching devices to be turned on is changed to find the conditions under which the inclination of the detected current waveform is equal to the inclination of the reference A.

When a current waveform whose inclination corresponds to the reference A is obtained, it implies that the current detection circuit having detected the current is operating normally. Therefore, based on this fact, the switching device to be turned on is changed to detect the current waveforms in succession, and it is checked whether or not their inclinations are equal to the inclination of the reference A, thereby locating abnormal spots.

In the case where the inclination of the detected current waveform is small or "0" even though the combination of the switching devices to be turned on is changed, both the current detection circuits can be presumed to be very probably abnormal.

Further, as shown in (e) of FIG. 2, when the inclination of the current detected by the current detection circuit IR or IS differs largely from or is greater than the inclination corresponding to the reference A, it implies that one or both of the current detection circuits IR and IS having detected the current is or are operating normally, and is also indicates that either the cable or motor winding is shorted in the circuit through which the current flows.

For example, in the case where the switching devices Tra and Trd are turned on to cause the current to flow through the switching device Tra, R-phase cable, R-phase windings, S-phase winding, S-phase cable, and switching device Trd, and if the inclination of the waveform of the current detected by means of the current detection circuits IR and IS is greater than the inclination correspond corresponding to the reference A, as indicated by full line in (e) of FIG. 2, the R-phase cable, S-cable, R-winding, or S-winding can be presumed to have been shorted. In such a case, for example, when the switching devices Tra and Trf are turned on to cause the current to flow through the switching device Tra, R-phase cable, R-phase winding, T-phase winding, T-phase cable, and switching device Trf, if the inclination of the waveform of the current detected by means of the current detection circuit IR is equal to the inclination corresponding to the reference A, the S-phase winding or the S-phase cable can be presumed to have been shorted. However, if the inclination of the waveform of the current detected by means of the current detection circuit IR is greater than the reference A, as shown in (e) of FIG. 2, the R-phase cable or the R-phase windings can be presumed to have been shorted.

Moreover, as shown in FIG. 2 and as mentioned before, the energy stored in the motor windings when the switching devices are turned off is returned to the smoothing capacitor C of the DC power source through the diodes (Da to Df). Therefore, the leading edge of the current obtained when the switching devices are turned on is equivalent to the reference A and is not abnormal. If the trailing end of the detected current obtained when the switching devices are turned off is different from the reference A, however, the diodes through which the current flows can be presumed to be abnormal.

Thus, in the drive control apparatus for drivingly controlling the motor by means of the inverter, the switching devices of the inverter are selectively turned on to supply the current to the motor, whereby the failures or other abnormalities in the current detection circuit existing in the drive control apparatus, abnormalities in the windings of the motor, abnormalities in the cables, abnormalities in the switching devices of the inverter, diode abnormalities, etc. can be detected and diagnosed by using the detected current from the current detection circuit.

What is claimed is:

1. An abnormality diagnosis method for circuit components of an inverter drive control apparatus for drivingly controlling a multi-phase motor, each phase being supplied a current through a switching device thereof, comprising:

turning on a selected two or more of a plurality of switching devices constituting an inverter and supplying a current between selected phases; and troubleshooting the circuit components through which the current flows in accordance with detection results detected by current detection circuits corresponding to the phases.

2. The method of claim 1, wherein said selection of the switching device to be turned on and the selection of the phases associated therewith are carried out at least twice in different combinations, and the circuit components concluded to be abnormal are identified by comparing the detection results for each cycle.

3. The method of claim 1, wherein the current supplied is control pulses with a given width.

4. The method of claim 2, wherein the detection results detected by the current detection circuits are current leading-edge waveforms.

5. The method of claim 2, wherein the detection results detected by the current detection circuits are current trailing-edge waveforms.

6. The method of claim 1, wherein the circuit components to be troubleshot include the current detection circuits, transistors as the switching devices, diodes connected in parallel with the transistors, windings for individual phases, and cables connected to the windings for the individual phases.

7. A method for diagnosing abnormalities of circuit components of an inverter drive control apparatus for controlling a motor, comprising:

turning on a least two of a plurality of switching devices of the inverter such that current flows between selected phases of the motor;

determining current waveforms detected by current detection circuits corresponding to the selected phases, and comparing inclinations of the detected waveforms to a reference inclination; and selecting a different combination of switching devices, if the inclinations of the detected waveforms are not substantially equal to the reference inclination, and repeating comparison of detected waveform inclinations until faulty circuit components are located.

* * * * *